United States Patent [19]

Jester et al.

[11] Patent Number: 5,719,354
[45] Date of Patent: Feb. 17, 1998

[54] MONOLITHIC LCP POLYMER MICROELECTRONIC WIRING MODULES

[75] Inventors: Randy Douglas Jester, Greer; Edwin Charles Culbertson, Rock Hill, both of S.C.; Detlef M. Frank, Mainz, Germany; Sherman Hall Rounsville; John Arthur Penoyer, both of Greenville, S.C.; Takeichi Tsugaka, Kurashiki, Japan; Minoru Onodera, Kurashiki, Japan; Toshiaki Sato, Kurashiki, Japan; Toru Sanefuji, Kurashiki, Japan

[73] Assignees: Hoechst Celanese Corp., Somerville, N.J.; Kuraray Company Ltd., Osaka, Japan

[21] Appl. No.: 307,958

[22] Filed: Sep. 16, 1994

[51] Int. Cl.[6] .................................... H05K 1/02
[52] U.S. Cl. ................. 174/255; 361/792; 174/259
[58] Field of Search .................... 174/255, 259, 174/262, 263, 264, 265, 266; 361/792

[56] References Cited

U.S. PATENT DOCUMENTS

| | | | |
|---|---|---|---|
| 4,318,954 | 3/1982 | Jensen | 428/209 |
| 5,259,110 | 11/1993 | Bross et al. | 29/830 |
| 5,282,312 | 2/1994 | De Stefano et al. | 29/830 |
| 5,338,208 | 8/1994 | Bross et al. | 439/66 |
| 5,527,998 | 1/1996 | Anderson | 174/255 |

*Primary Examiner*—Kristine L. Kincaid
*Assistant Examiner*—Kristina Soderquist
*Attorney, Agent, or Firm*—James L. McGinnis

[57] ABSTRACT

The invention provides a multilayer microelectronic circuit board including a laminate of a plurality of circuit layers containing conductive vias within the layers or a combination of conductive vias and conductive wiring patterns on a surface of the layers, the layers comprising a first liquid crystal polymer and, interposed between said circuit layers, a layer of second liquid crystal polymer having a melting point of at least about 10° C. lower than the melting point of the first liquid crystal polymer. The boards are produced by stacking a plurality of circuit layer sheets in appropriate electrical alignment such that they are separated by an interposed layer of the second liquid crystal polymer of lower melting point, and heating the stacked polymer sheets under pressure sufficient to bond the sheets or layers into a microelectronic printed circuit board, the temperature of the heating being sufficient to melt the lower melting second polymer but insufficient to melt the polymer present in the circuit layers. The second polymer layer may be interposed as a separate sheet during assembly or may be present as one or two separate surface layers in contact with the higher melting point polymer of the circuit layers.

12 Claims, 2 Drawing Sheets

MONOLITHIC LCP POLYMER MICROELECTRONIC WIRING MODULES

BACKGROUND OF THE INVENTION

1. Field of the Invention

This invention relates to improved multilayer microelectronic wiring modules containing a plurality of liquid crystal polymer layers laminated together.

2. Description of Related Art

Multilayer printed circuit boards (PCB) are known in the electronics industry as a base to provide conducting paths among the various components mounted on the board. The common PCBs comprise a plurality of layers which are fabricated to contain a conductive wiring pattern on the layer faces and a number of electrically conductive vias formed through each layer (blind vias) such that when a plurality of such layers are laminated together in appropriate alignment using heat and/or pressure, useful electrically conductive interlayer pathways are formed within the PCB. After the layers are laminated together, typical hole forming and plating techniques are used to produce useful electrical pathways through the PCB to produce conductive vias. Typically, the layers of the multilayer printed circuit Board are bonded using a thermosetting or crosslinkable polymeric resin. In some instances this bonding material is comprised of a thermoplastic polymeric resin such that the resin melts to form an adhesive bond between the layers of the multilayer circuit board.

One of the problems associated with the use of layers composed of polymeric material, particularly thermoplastic polymeric material, is that heat and pressure must be normally applied during fabrication of the circuit board to melt the polymer sufficiently such that a good adhesive bond is established at each layer interface.

Where the layer material is a mono- or biaxially oriented sheet material, the molecular orientation of the layer can be heat-altered such that the layer changes shape, shrinks, curls or otherwise distorts, or circuitry distorts or breaks. Even slight changes in shape can adversely affect the electrical properties of the multilayer PCB and can lead to cohesive voids within the PCB between the polymer phases or adhesive voids between the polymer/conductive metal phases.

One proposed solution to this problem involves the use of an adhesive as a sandwich layer between the circuit layers, e.g., a polyamic acid adhesive joining polyamide-based circuit layers. Where thermoplastic polymers are used as circuit layers, it is possible to use a separate layer of the thermoplastic as an adhesive layer. These adhesive layers can function both as a dielectric layer encapsulating wiring traces and also provide adhesion to the dielectric layers separating circuit traces on adjacent circuit layers.

But the use of adhesive layers introduces a number of problems and variables into fabrication of these boards and their performance. The adhesive layer may have differing (normally inferior) dielectric properties compared with the polymer material forming the circuit layer. The adhesive layer is also normally softer than the circuit layer material which can lead to smearing during subsequent drilling operations used to produce connecting vias, requiring a desmearing step. Also, the typically high coefficient of thermal expansion of the adhesive layer can also increase the incidence of solder barrel cracking on plated through holes.

While many of these problems are avoided by using the same polymer for both the adhesive and circuit layers, the amount of heat applied to soften, melt or cure the adhesive layer to produce a good inter-layer bond will also adversely effect the circuit layers as described above, causing shrinkage, misalignment and destruction of electrical continuity.

U.S. Pat. No. 5,259,110 discloses electronic printed circuit boards wherein the circuit layers are composed of a liquid crystal polyester polymer (LCP). The patent discloses that a plurality of such layers may be bonded together by heat and pressure, and that an adhesive layer such as a polyamide or another LCP layer may be interposed between the LCP circuit layers prior to thermal bonding of the circuit layers. However, fabrication of the disclosed boards using an LCP adhesive layer would still require that it be heated at or above the melting point of the LCP polymer in order to achieve satisfactory adhesion, which can result in a distortion of the sheet material and a loss of electrical properties for the reasons discussed above.

SUMMARY OF THE INVENTION

The present invention provides a multilayer printed circuit board comprising a laminate of a plurality of circuit layers containing conductive vias within the layers, conductive wiring patterns on one or both surfaces of the layers, or a combination of conductive vias and conductive wiring patterns on the surface of the layers, said layers comprising a first liquid crystal polymer and, interposed between said circuit layers, a layer of second liquid crystal polymer having a melting point of at least about 10° C. lower than the melting point of said first liquid crystal polymer. The boards are produced by stacking a plurality of circuit layer sheets in appropriate registration such that they are separated by an interposed layer of the second liquid crystal polymer of lower melting point, and heating the stacked polymer sheets under pressure sufficient to bond the sheets or layers into a microelectronic printed circuit board, the temperature of the heating being sufficient to melt the lower melting second polymer but insufficient to melt the polymer present in the circuit layers. The second polymer layer may be interposed as a separate sheet during assembly, which sheet may be composed solely of the second liquid crystal polymer or may comprise a multilayer film or multilayer assembly of films of said first and second liquid crystal polymers.

The invention provides the advantage that the circuit layers of the PCB containing the electrical wiring can be bonded together without the need to heat the liquid crystal polymer component of the circuit layers at or above its melting point, thereby avoiding any significant alteration of the molecular orientation of the crystalline polymer chains and consequent distortion of the circuit layer material which contains the electric wiring.

The second lower melting temperature polymer may also be laminated over the exposed outer circuit layer in the multilayer PCB to produce a protective cover.

The resulting PCB is a monolithic all-liquid crystalline polymer structure which is relatively simple to assemble and which exhibits more reliable electrical properties.

DETAILED DESCRIPTION OF THE INVENTION

Figure 1A:
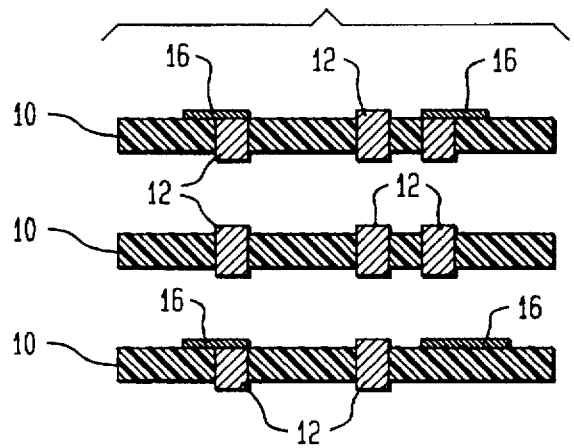
FIG. 1A is a side sectional view of a plurality of polymer circuit layers stacked together and aligned prior to being laminated together.

Microelectronic PCBs prepared by laminating together thermoplastic layers having conductive vias therein or a combination of conductive vias and surface applied conductive wiring patterns are known in the art. FIG. 1A illustrates a side sectional view of a multilayer PCB with the layers stacked and aligned prior to being laminated. Vias 12 may be produced by drilling, punching (conventional drilling, laser or plasma formed), or molding holes in sheet layer 10, after assembly of the circuit layer, followed by forming metal connectors in the holes which provide an electrical connection from the top to the bottom surfaces of the sheets (by filling the holes with solder or by electroplating the hole circumference). Conductive wiring patterns or distribution planes shown at 16 may then be added to some of the sheets by suitable known techniques such as by applying a thin layer of a conductive metal such as copper, silver, aluminum or copper-chromium to a surface of sheet 10 and forming a conductive pattern by any suitable technique such as computer controlled etching or the more conventional photoresist exposure followed by development and mask etching.

The circuit layer sheets 10 are then ready to be stacked in appropriate electrical registration and thermally compressed, during which process the thermoplastic properties of the sheets or any adhesive which may be applied between adjacent sheets cause the sheets to bond together to provide a multilayer PCB of mechanical integrity.

A more complete description of such multilayer PCBs and the fabrication thereof is found in U.S. Pat. No. 5,259,110, the complete disclosure of which is incorporated herein by reference.

The present invention represents an improvement in the fabrication of multilayer microelectronic circuit boards wherein the circuit layers comprising a liquid crystal polymer are joined together by an interposed adhesive layer which comprises another liquid crystal polymer, wherein the interposed adhesive layer has a melting point at least 10° C. lower than the polymer present in the circuit layer.

Suitable liquid crystal thermoplastic polymers which may be used as polymer components in the fabrication of the modules include polyesters comprising monomer units derived from 4-hydroxybenzoic acid and 2,6-hydroxynaphthoic acid; a polyester comprising monomer units derived from 2,6-hydroxynaphthoic acid, terephthalic acid, and acetaminophen; and a polyester comprising monomer units derived from 4-hydroxybenzoic acid, terephthalic acid and 4,4'-biphenol.

Particular preferred polyesters are those available from Hoechst Celanese Corporation under the trademark VECTRA®.

VECTRA® A polyester comprises 73 mole % of monomer units derived from 4-hydroxybenzoic acid ("HBA") and 27 mole % of monomer units derived from 2,6-hydroxynaphthoic acid ("HNA").

VECTRA® E polyester comprises 60 mole % of monomer units derived from HBA, 4 mole % of monomer units derived from HNA, 18 mole % of monomer units derived from terephthalic acid ("TA"), and 18 mole % of monomer units derived from p,p'-biphenol.

Other preferred embodiments include VECTRA® C (m.p. about 320° C.) and/or VECTRA® B polyesters. VECTRA® C polyester comprises 80 mole % of monomer units derived from HBA and 20 mole % of monomer units derived from HNA. VECTRA® B polyester comprises 60 mole % of monomer units derived from HNA, 20 mole % of monomer units derived from TA, and 20 mole % of monomer units derived from acetaminophen.

It is also within the scope of the present invention to use liquid crystal polymers other than the VECTRA® polyesters described above. Generally, any such polymers that will bond together may be used in practicing this invention. Examples of such liquid crystal polymers include, but are not limited to XYDAR® LCP (a polyester made by Amoco Co.) comprising units derived from HBA, TA and 4,4'-biphenol, as well as other mesogenic group-containing LCP's.

The LCP polymers may be fabricated into individual films or sheets using any suitable melt processing method as known in the art, such as disclosed in U.S. Pat. No. 4,384,016, but cast film extrusion followed by mono- or biaxial orientation of the film or blown film extrusion are preferred methods. After the film has been extruded, orientation may be produced in any conventional manner; for example, drawdown will orient the LCP film in the machine direction, while transverse stretching will orient the film in the transverse direction. Machine shear orientation may also occur due to conventional machine direction flow, whereas transverse shear orientation may occur due to moving die surfaces, e.g. in rotating or counter-rotating annular dies.

The present invention also encompasses the use of multilayer films as the circuit layer film and/or the adhesive layer film. These films may be bilayer H/L films or trilayer L/H/L films where L represents the lower melting polymer and H represents the higher melting polymer. Thus, a plurality of H/L circuit layers with circuit traces on the "H" layer can be assembled together and heat compression bonded such that an "L" layer is interposed between each "H" layer. Alternatively, circuit layers composed of an H film can be bonded together using an "L" film or an "L/H/L" film as the adhesive layer.

In one preferred method for making multi-component films or sheets according to the present invention, two extruders are used to extrude two polymers having different melting points. A combining block is used to guide the polymers into a single die so that the lower melting polymer forms an outer layer, or the outermost layers where a trilayer film is made. In another preferred embodiment of this method, a multimanifold die is used instead of the combining block and die. The extruders, dies, and combining blocks useful in the practice of the present invention are well-known to those skilled in the art. It is contemplated that a wide variety of such equipment may be used in various combinations, the choice of which partly will depend upon the polymers that are used and the number and thicknesses of the layers that are desired.

When the adhesive sheet is a trilayer "L/H/L" sheet, the inner layers of the film or sheet need not all have the same melting point, but at least one inner layer should have a melting point sufficiently higher than the melting point of the two outer layers so that the outer layers may be melted without melting that inner layer. This arrangement of layers allows the outer layers to be melt laminated or bonded while the inner layer maintains its shape, structure, rigidity, and other physical properties.

Film thicknesses may vary within wide limits for both the circuit layers and adhesive layers. Films having a thickness in the range of about 0.5 to 20 mils are preferred for the circuit layer and a thickness of 0.5 to 20 mils are preferred for the adhesive layers. Where multilayer H/L or L/H/L films are employed, the preferred thickness for the "L" layer ranges from 0.1 to 10 mils and for the "H" layer from 0.25 to just under 20 mils.

As indicated above, the melting point differential between the LC polymers used to make the "L" and "H" layers should be greater than about 10° C., preferably greater than about 25° C. and more preferably greater than about 50° C. The greater this differential, the greater is the heat window between the points where the low and high melting point LCP's melt, which affords a greater variation of operating temperatures when the various layers are compression heated during the fabrication of the microelectronic PCB. For example, VECTRA® A resin melts at about 280° C; VECTRA® C resin melts at about 320° C.; and VECTRA® E resin melts at about 350° C. This suggests a combination of C resin as the higher melting polymer and A resin as the lower melting polymer, or a combination of E resin as the higher melting polymer with either C resin or A resin as the lower melting polymers. A preferred combination comprises a polymer with a melting point above about 315° C. and a polymer with a melting point of 285° C. or less.

The temperature and pressure conditions used for the lamination process will vary depending on the melting points of the "H" and "L" polymers used as layers in the assembly. Preferably the maximum heating temperature and lamination time will be sufficient to thoroughly melt the "L" polymer film without melting the "H" polymer film. Laminating pressures in the range of about 15 to about 500 lbs/sq. in. may be used. Preferably the lamination is conducted by raising the temperature of the assembly gradually over a period of at least about 5 minutes to a maximum temperature which is higher than the melting temperature of the adhesive "L" layers present in the assembly, preferably at least about 2° above such melting temperature, more preferably at least 5° C. above such melting temperature.

Figure 1C:
FIG. 1C is a side sectional view of a multilayer adhesive sheet.
Figure 1B:
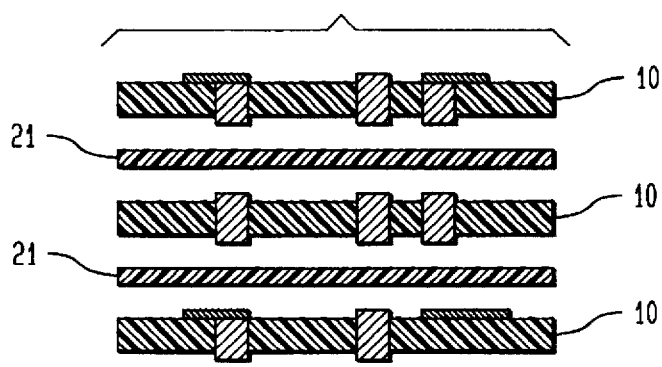
FIG. 1B is a side sectional view of the circuit layers of FIG. 1A having a sheet of adhesive layer interposed between circuit layer sheets.

Referring back to the drawings, FIG. 1B shows a side sectional view of the assembly of circuit layers of FIG. 1A having a sheet of a single adhesive layer 21 interposed between circuit layers 10 of FIG. 1A. In this embodiment, circuit sheet layer 10 is composed of the "H" polymer and interposed sheet layer 21 is composed of the "L" polymer.

FIG. 1C shows another embodiment of the invention wherein adhesive sheet 21 is either a multilayer composite film or three separate laid up films wherein outer layers 22 are composed of the "L" polymer and inner layer 23 is composed of an "H" polymer, which may be the same as the "H" polymer shown at 10 in FIG. 1B. In this embodiment, layers 22 serve as adhesive layers and layers 22 and 23 combined function as dielectric layers.

Figure 1D:
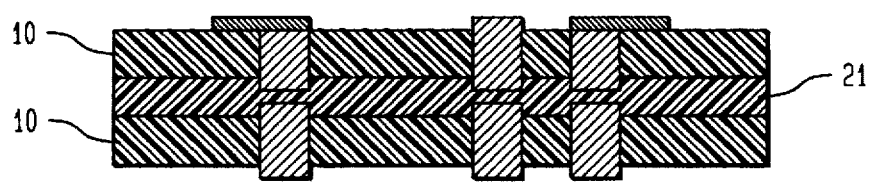
FIGS. 1D and 1E are side sectional views of two of the polymer circuit sheets of FIG. 1B laminated together to form a multilayer PCB.

FIG. 1D shows the stacked top two layers of FIG. 1B and interposed adhesive after the application of heat and pressure, laminated together to form part of a multilayer PCB. In this embodiment, layer 21 serves as an adhesive layer bonding circuit layers 10 together. Selected vias may be electrically connected by subsequent drilling through adhesive layer 21 and metal application to afford electrical connection.

Figure 1E:
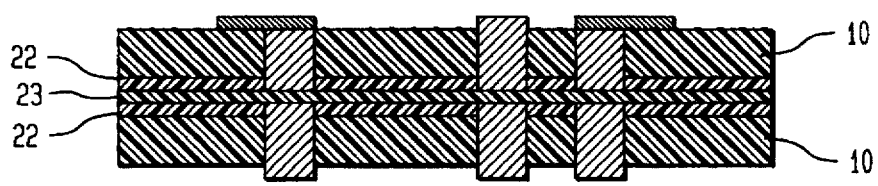

FIG. 1E shows the stacked top two layers of FIG. 1B wherein the interposed adhesive layer is the multilayer arrangement of FIG. 1C. In this embodiment the "L" adhesive layers 22 serve to encapsulate the exposed wiring patterns and provide adhesion between circuit layers 10 and dielectric layer 23. As in FIG. 1D, selected vias may be electrically connected by subsequent drilling through the adhesive and dielectric layers and metal application.

Films made according to the present invention may be oriented in any direction and to any degree, including uniaxially and biaxially. Orientation may be produced in any conventional manner; for example, drawdown will orient the LCP layers in the machine direction, while stretching will orient them in the stretch direction. Machine shear orientation will be mainly confined to the outer layers, since inner layers will have been insulated from contact with die surfaces.

The PCBs prepared in accordance with the invention may be characterized as monolithic, all-LCP circuit boards. Suitable monolithic structures which may be obtained include the following specific embodiments:

A. Coextruded adhesive films consisting of a H-Resin core with thin L-Resin layers on each side are placed between circuitized layers of H film. A coextruded H-Resin film with a thin L-Resin coextruded layer on one side is placed on the outside layers of the stack (L-Resin side in facing circuit) as a protective cover on the exterior circuit. The laminate is laminated under conditions where the L-Resin layers will melt sufficiently to obtain good adhesion, but the H-Resin will not melt, thereby, maintaining good circuit registration.

B. A modified low melting temperature L film is used as an adhesive layer between layers of circuitized higher melting point H films. The laminate structure is pressed under conditions where the lower melting LCP melts but the LCP used for the circuitized layer does not, to produce a fused all LCP structure.

Figure 1F:
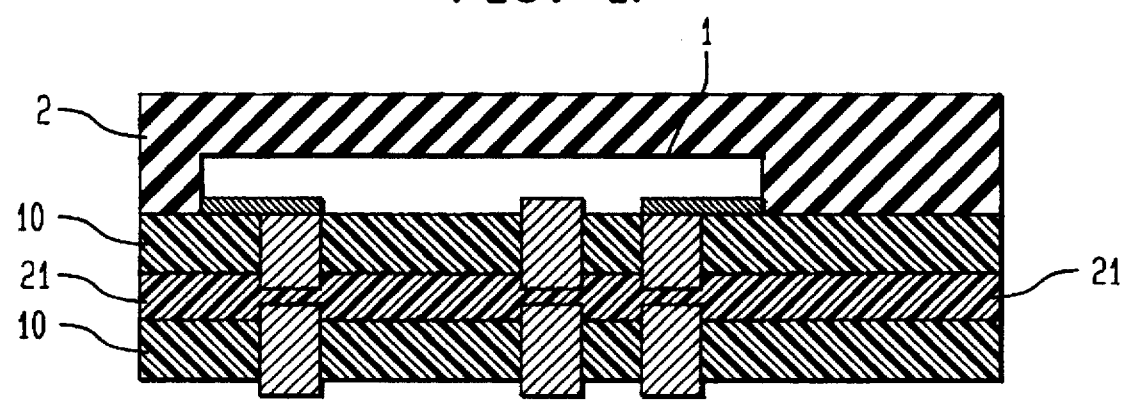
FIG. 1F is a side sectional view of the multilayer PCB shown in FIG. 1D, and also includes surface mounted components encapsulated in the low melting temperature L film.

C. A thick 20 mil film of a low melting temperature L resin is placed on the surface of an all LCP board with surface mounted components. The laminate structure is heated to a point above the melting temperature of the thick L film and below the melt temperature of the LCP polymers used in the circuitized layers. A low pressure is applied and the thick film melt encapsulates the surface components to produce a "monolithic" all LCP circuit board. This "monolithic" all LCP circuit board is illustrated schematically in FIG. 1F, where the all LCP board shown in FIG. 1D now includes surface mounted components 1 encapsulated inside low temperature L film 2, which could be adhesive layer 21 or another low melting LCP.

The following examples are illustrative of the invention; however, the invention is not limited to the embodiments illustrated.

EXAMPLE 1

Copper Clad Laminates (CCL) having VECTRA® C-Resin film as a dielectric were circuitized using conventional printed circuit board (PCB) processing techniques (photoresist, image, etch) to produce the four circuitized layers for producing a multilayer PCB of Military 50884 specifications. VECTRA C-Resin film has a melting point of 320° C. These circuitized layers (6 mil Vectra C-Resin film) were configured in the proper order and position with intervening layers of 2 mil VECTRA cast extruded A-Resin film as adhesive. VECTRA A-Resin film has a melting point of 280°–282° C. The laid up multilayer materials were placed in a conventional laminating press with Teflon release pads and laminated under the following conditions:

| STEP | TEMP. (°C.) | TIME (min) | PRESS PRESSURE (tons) |
| --- | --- | --- | --- |
| 1 | 93.4 | 7 | 1 |
| 2 | 121 | 4 | 1 |
| 3 | 176.8 | 7 | 1 |
| 4 | 232.4 | 7 | 1 |
| 5 | 288 | 2 (hold time) | 3 |
| Cool | | | |

Testing of the resulting microelectronic PCB indicated that it passed all major MIL-50884 test standards, e.g., there was no cracking in the conductive surfaces or separation of the conductive surfaces, there was no evidence of plating voids and there was no evidence of laminate voids.

EXAMPLE 2

A printed wiring board consisting of a 4-mil thick, biaxially oriented VECTRA® C resin film and 18-μ thick copper foil, and having wiring circuits of 0.1-mm width and 0.1-mm pitch was prepared by conventional printed circuit board (PCB) processing techniques (photoresist, image, etch). The biaxially oriented, VECTRA® C resin film has a melting point of 320° C.

Two sheets of the thus obtained circuitized film were configured in the proper order and position, with an intervening layer of 1.25-mil thick, biaxially oriented VECTRA® A resin film as adhesive. The biaxially oriented VECTRA® A resin film has a melting point of 280° C.

The laid up multilayer materials were placed in a conventional vacuum laminating press with 4-mil thick polyimide release films and laminated under the following conditions.

| Step | temp. (°C.) | Time (min) | Press Pressure (kg/cm²G) |
| --- | --- | --- | --- |
| 1 | 260 | 15 | under vacuum |
| 2 | 260 | .1 (hold time) | 10 |
| 3 | 285–287 | 5 (hold time) | 10 |
| Cool | | | |

The 4-mil thick polyimide release films were then removed from the obtained laminated. There was found no evidence of laminate voids. There was neither cracking in the conductive surfaces nor separation of the conductive surfaces. The peel strength between the VECTRA® C resin film and VECTRA® A resin film was found to be 0.6 kg/cm.

EXAMPLE 3

Example 2 was repeated except that the press temperature in step 3 was changed to 305°–308° C. The results are shown in Table 1.

EXAMPLE 4

Example 2 was repeated except that the press temperature in step 3 was changed to 315°–318° C. The results are shown in Table 1.

COMPARATIVE EXAMPLE 1

Example 2 was repeated except that the press temperature in step 3 was changed to 278°–280° C., which is below the melting point of the VECTRA® A resin film used as adhesive. Although no cracking or separation was observed on the conductive surfaces, many voids were observed near the wiring. The peeling strength between the VECTRA® C resin film and VECTRA® A resin film was 0.05 kg/cm, which means that the laminate readily undergoes delamination and is hence not usable in practice.

COMPARATIVE EXAMPLE 2

Example 2 was repeated except that the press temperature in step 3 was changed to 320°–323° C., which is above the melting point of the VECTRA® C resin film used as substrate. Although no laminate voids were found, the substrate VECTRA® C resin film had deformed to a large extent and many cracks and separation parts were observed on the conductive surfaces. Because of the large deformation of the film, the peel strength between the VECTRA® C resin film and VECTRA® A resin film could not be measured.

TABLE 1

| | Example 2 | Example 3 | Example 4 | Comparative Example 1 | Comparative Example 2 |
| --- | --- | --- | --- | --- | --- |
| Laminating temperature at step 3 | 285–287 | 305–308 | 315–318 | 278–280 | 320–323 |
| Peel Strength kg/cm | 0.6 | 1.8 | 1.8 | 0.05 | could not be measured |
| Laminated Voids | None | None | None | Yes | None |
| Cracking or Separation in the Conductive Surface | None | None | None | None | Yes |

Many variations and equivalents of the present invention will occur to those skilled in the art. The present invention is not limited to the embodiments illustrated or described, but includes all the subject matter within the spirit and scope of the appended claims and of the foregoing disclosure.

What is claimed is:

1. A multilayer microelectronic printed circuit board comprising a laminate of a plurality of circuit layers selected from the group consisting of circuit layers containing conductive vias within the layers, conductive wiring patterns on one surface of the layers, conductive wiring patterns on both surfaces of the layers, and a combination of conductive vias and conductive wiring patterns on the surfaces of the layers, said circuit layers comprising a first liquid crystal polymer, and interposed between said circuit layers an adhesive layer comprising a second liquid crystal polymer having melting point of at least about 10° C. lower than the melting point of said first liquid crystal polymer.

2. The board of claim 1 wherein the melting point of said second liquid crystal polymer is at least about 25° C. lower than said first liquid crystal polymer.

3. The board of claim 2 wherein the melting point of said second liquid crystal polymer is at least about 50° C. lower than said first liquid crystal polymer.

4. The board of claim 1 wherein said liquid crystal polymers are polyester polymers.

5. The board of claim 4 wherein all said liquid crystal polyester polymers are selected from the group consisting of: a polyester comprising monomer units derived from 4-hydroxybenzoic acid and 2,6-hydroxynaphthoic acid; a polyester comprising monomer units derived from 2,6-hydroxynaphthoic acid, terephthalic acid, and acetaminophen; and a polyester comprising monomer units derived from 4-hydroxybenzoic acid, terephthalic acid and 4,4'-biphenol.

6. The board of claim 1 wherein said first liquid crystal polymer has a melting point above about 335° C. and said second liquid crystal polymer has a melting point of not more than 325° C.

7. The board of claim 1 wherein said first liquid crystal polymer has a melting point above about 315° C. and said second liquid crystal polymer has a melting point of not more than 285° C.

8. The board of claim 1 wherein said adhesive layer consists of said second liquid crystal polymer.

9. The board of claim 1 wherein said adhesive layer comprises a laminate of two layers of said second liquid crystal polymer having interposed therebetween a layer of liquid crystal polymer having a melting point of at least 10° C. higher than said second liquid crystal polymer.

10. The board of claim 9 wherein said interposed liquid crystal polymer is the same polymer as said first liquid crystal polymer.

11. The board of claim 1 wherein said circuit layers and said adhesive layer has a thickness in the range of from about 0.5 to 20 mils.

12. The board of claim 1 which contains electrical components mounted on a surface of said board and which components are encapsulated by a film of liquid crystal polymer.

* * * * *